(12) United States Patent
Grutzeck et al.

(10) Patent No.: US 10,246,318 B2
(45) Date of Patent: Apr. 2, 2019

(54) MICROMECHANICAL COMPONENT AND PRODUCTION METHOD FOR A MICROMECHANICAL COMPONENT

(71) Applicant: Robert Bosch GmbH, Stuttgart (DE)

(72) Inventors: Helmut Grutzeck, Kusterdingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/702,034

(22) Filed: Sep. 12, 2017

(65) Prior Publication Data

US 2018/0072560 A1    Mar. 15, 2018

(30) Foreign Application Priority Data

Sep. 13, 2016   (DE) .................. 10 2016 217 371

(51) Int. Cl.
| | |
|---|---|
| *B81B 3/00* | (2006.01) |
| *H04R 19/00* | (2006.01) |
| *H04R 19/04* | (2006.01) |
| *H02N 1/00* | (2006.01) |
| *G01L 9/00* | (2006.01) |

(52) U.S. Cl.
CPC .......... *B81B 3/0037* (2013.01); *B81B 3/0021* (2013.01); *G01L 9/0072* (2013.01); *H02N 1/008* (2013.01); *H04R 19/005* (2013.01); *H04R 19/04* (2013.01); *B81B 2201/0257* (2013.01); *B81B 2201/0264* (2013.01); *B81B 2201/033* (2013.01); *B81B 2203/0127* (2013.01); *B81B 2203/0172* (2013.01); *B81B 2203/04* (2013.01); *H04R 2201/003* (2013.01)

(58) Field of Classification Search
CPC .................. H04R 19/00; H04R 19/04; H04R 2201/0257; B81B 2201/0257; B81B 2201/0264; B81B 2201/003
See application file for complete search history.

(56) References Cited

U.S. PATENT DOCUMENTS

| | | | |
|---|---|---|---|
| 6,175,170 B1 | 1/2001 | Kota et al. | |
| 2015/0198493 A1* | 7/2015 | Kaelberer | G01P 15/0802 73/718 |

FOREIGN PATENT DOCUMENTS

| | | |
|---|---|---|
| DE | 102014200500 A1 | 7/2015 |
| WO | 01/89 986 A1 | 11/2001 |

* cited by examiner

*Primary Examiner* — Sunita Joshi
(74) *Attorney, Agent, or Firm* — Norton Rose Fulbright US LLP; Gerard Messina (57) ABSTRACT

A micromechanical component having a substrate, a membrane that covers an opening structured into the substrate from a first side of the substrate and that can be warped by a pressure difference between the first side of the substrate and a second side, oriented away from the first side, of the substrate, and having at least one actuator electrode that is connected at least to the membrane in such a way that the at least one actuator electrode can be displaced relative to the substrate by a warping of the membrane, the at least one actuator electrode being capable of being displaced relative to the substrate by the warping of the membrane, in each case along a displacement axis oriented parallel to the second side of the substrate. A production method for a micromechanical component is also described.

10 Claims, 6 Drawing Sheets

MICROMECHANICAL COMPONENT AND PRODUCTION METHOD FOR A MICROMECHANICAL COMPONENT

CROSS REFERENCE

The present application claims the benefit under 35 U.S.C. § 119 of German Patent Application No. DE 102016217371.5 filed on Sep. 13, 2016, which is expressly incorporated herein by reference in its entirety.

FIELD

The present invention relates to a micromechanical component, a microphone, and a pressure sensor. The present invention also relates to a production method for a micromechanical component.

BACKGROUND INFORMATION

In German Patent Application NO. DE 10 2014 200 500 A1, a micromechanical pressure sensor device and a production method for producing the device are described. The micromechanical pressure sensor device has a wafer having an opening structured through the wafer, which opening is covered by a mounted membrane in such a way that the membrane can be warped by a pressure difference between a front side of the wafer and a rear side of the wafer. Moreover, at least one actuator electrode is connected to the membrane, and in addition to the wafer via a spring device, in such a way that the at least one actuator electrode can be deflected by a warping of the membrane, against a spring force of the spring device. The spring device is made relatively soft, and in particular permits deflections of the at least one actuator electrode perpendicular to the plane of the wafer. PCT Application No. WO 01/89 986A1 describes a capacitive microphone in which an acoustically sensitive plate is connected to a flexible membrane via a beam situated parallel to the plate. On this flexible membrane there are situated electrodes that follow the movement of the membrane and thus produce a measure of the movement of the membrane via a change in capacitance.

U.S. Pat. No. 6,175,170 B1 describes a deflection and multiplication of the displacement of a MEMS actuator.

SUMMARY

The present invention provides a micromechanical component. a microphone, and a pressure sensor.

The present invention provides micromechanical components in which a warping (oriented perpendicular to the second side of the substrate) of the respective membrane is converted into a displacement movement, oriented parallel to the second side of the substrate, of the at least one respective actuator electrode. As is explained in more detail below, such a realization of micromechanical components according to the present invention permits highly space-saving electrode configurations (of the at least one respective actuator electrode and at least one associated stator electrode) for detecting the warping of the respective membrane. In particular, the present invention reduces the space required for the formation of an electrode configuration having a large base capacitance.

Through the present invention, for the respective micromechanical component an electrode configuration can also be used in which the at least one respective actuator electrode and the at least one associated stator electrode are structured out from the same semiconductor layer. This increases a degree of freedom in the determination of electrode spacings (compared to conventional electrode configurations, in which actuator and stator electrodes are structured from different semiconductor layers).

Moreover, through the present invention electrode configurations can be realized in which a change in capacitance is a linear function of the pressure difference, causing the warping of the membrane, between the first side of the substrate and the second side of the substrate. A micromechanical component according to the present invention can therefore be used together with a comparatively low-cost evaluation electronics unit, requiring little constructive space, in a sensor such as a pressure sensor. In addition, a micromechanical component according to the present invention is relatively resistant to an action of external pressure or force.

In an advantageous specific embodiment of the micromechanical component, the at least one actuator electrode is connected to the membrane via at least one torsion spring, which is capable of rotation about a respective torsion axis by the warping of the membrane, in such a way that the at least one actuator electrode is capable of being displaced relative to the substrate by the warping of the membrane, in each case along its displacement axis oriented parallel to the second side of the substrate. In this way, a comparatively simple and easily producible spring type can be used to convert the warping of the membrane, oriented perpendicular to the second side of the substrate, into the displacement movement, oriented parallel to the second side of the substrate, of the at least one actuator electrode.

For example, the at least one actuator electrode can be connected to the membrane via a respective first torsion spring and a respective second torsion spring as the at least one torsion spring. As is explained in more detail below, a connecting of the at least one actuator electrode to the membrane via the two torsion springs allocated to it permits a reliable displacement of the at least one actuator electrode in the displacement movement advantageously oriented parallel to the second side of the substrate.

Preferably, a first height of the at least one first torsion axis of the at least one first torsion spring from the second side of the substrate differs from a second height of the at least one second torsion axis of the at least one second torsion spring from the second side of the substrate. In particular, a spacing of the at least one first torsion axis of the at least one first torsion spring from the second torsion axis of its associated second torsion spring can be smaller than fifteen times the difference between the first height of the respective first torsion axis from the second side of the substrate and the second height of the second torsion axis from the second side of the substrate.

Preferably, the at least one actuator electrode is connected to the substrate in each case via at least one U-shaped and/or meander-shaped spring in such a way that a displacement movement, oriented perpendicular to the second side of the substrate, of the at least one actuator electrode is prevented by the at least one U-shaped and/or meander-shaped spring. In this case, no free space must be present at a side of the at least one actuator electrode oriented away from the substrate, which facilitates a minimization of this specific embodiment of the micromechanical component.

In an advantageous specific embodiment, the at least one actuator electrode is in each case a comb electrode having electrode fingers oriented along and/or parallel to its axis of displacement. Alternatively, the at least one actuator electrode can also be in each case a comb electrode having electrode fingers oriented perpendicular to its axis of displacement. In both cases, as a result an electrode type can be used for the at least one actuator electrode that as a rule triggers a linear change in capacitance when there is a displacement movement.

Preferably, the micromechanical component has exactly two actuator electrodes as the at least one actuator electrode, and the membrane is centrally sectioned by a plane of symmetry relative to which the two actuator electrodes are mirror-symmetrical. Due to the mirror symmetry present in this specific embodiment, a conventional risk of tilting of the at least one actuator electrode is relatively low.

The advantages described above are also ensured in a microphone having a corresponding micromechanical component.

A pressure sensor having such a micromechanical component also has the advantages described above.

The advantages described above can also be realized by carrying out a corresponding production method for a micromechanical component. It is to be noted that the production method can be further developed according to the specific embodiments explained above of the micromechanical component.

BRIEF DESCRIPTION OF THE DRAWINGS

Below, further features and advantages of the present invention are explained.

FIGS. 1a and 1b show schematic representations of a first specific embodiment of the micromechanical component, FIG. 1a showing a top view and FIG. 1b showing a cross-section along the line AA' of FIG. 1a.

FIGS. 3a through 3h show schematic representations of a third specific embodiment of the micromechanical component, FIG. 3a showing a top view, FIGS. 3b and 3c showing cross-sections along the line AA' of FIG. 3a, FIGS. 3d and 3e showing cross-sections along the line BB' of FIG. 3a, FIG. 3f showing a cross-section along the line CC' of FIG. 3a, and FIGS. 3g and 3h showing cross-sections along the line DD' of FIG. 3a.

DETAILED DESCRIPTION OF EXAMPLE EMBODIMENTS

Figure 1A:
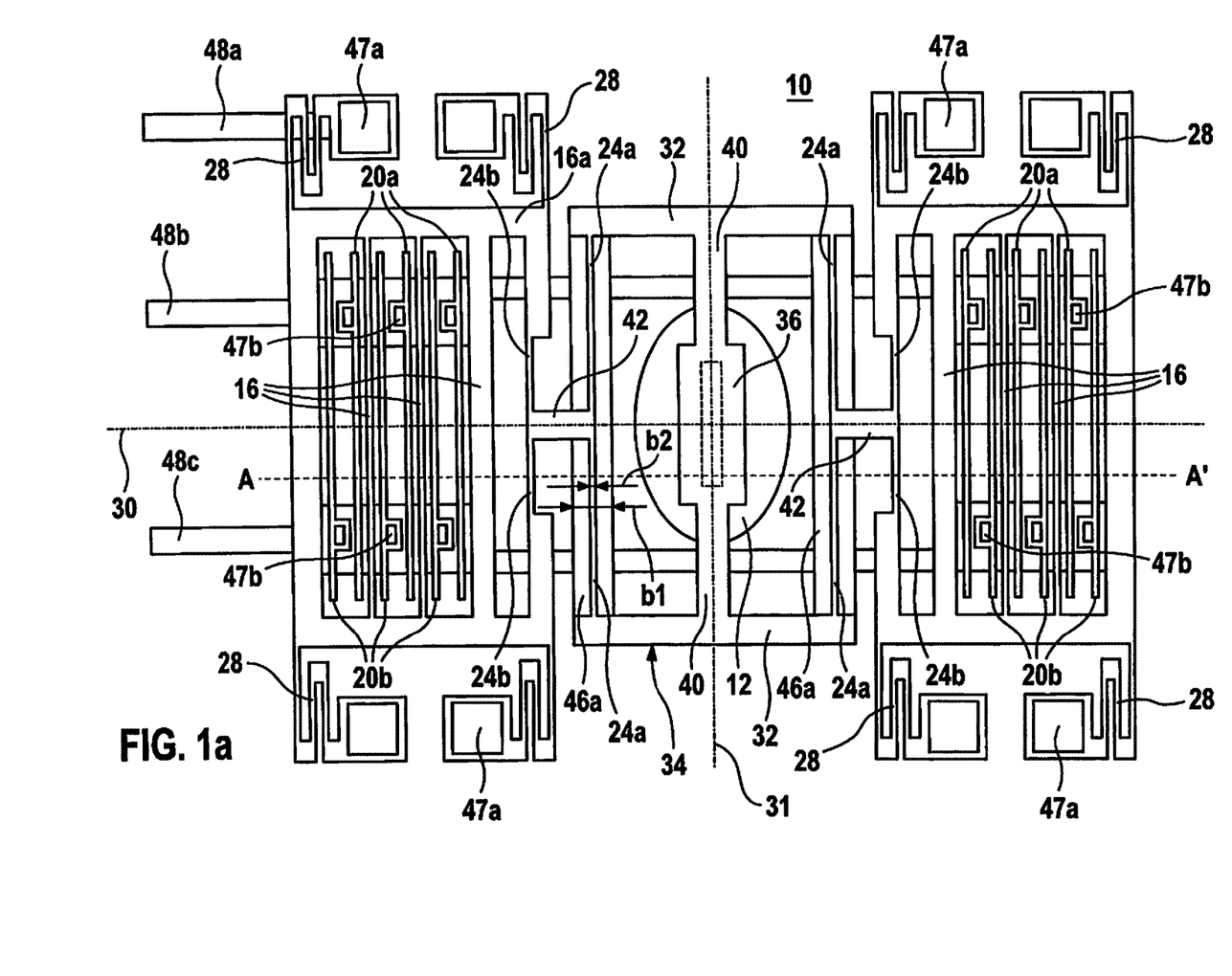
Figure 1B:
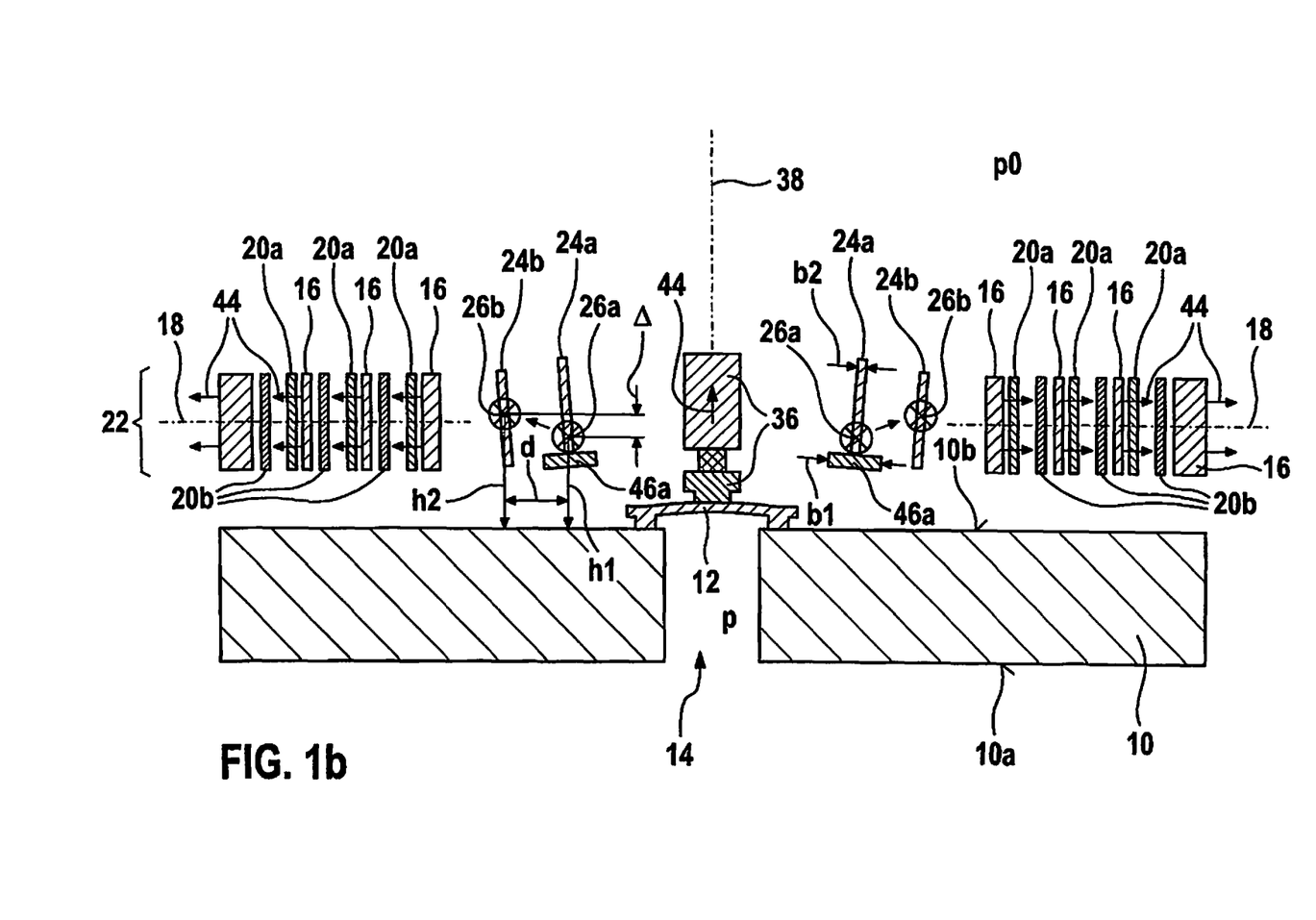

FIGS. 1a and 1b show schematic representations of a first specific embodiment of the micromechanical component, FIG. 1a showing a top view and FIG. 1b showing a cross-section along the line AA' of FIG. 1a.

The micromechanical component shown schematically in FIGS. 1a and 1b includes a substrate 10 and a membrane 12 that covers an opening 14 structured into substrate 10 from a first side 10a of substrate 10. Membrane 12 can for example limit an external volume of the micromechanical component having a pressure p present at first side 10a of substrate 10 from an inner volume of the micromechanical component having a reference pressure p0 (e.g., a near vacuum) at a second side 10b (oriented away from first side 10a) of substrate 10. Membrane 12 is capable of being warped/is warped (from its initial shape) by a pressure difference between first side 10a of substrate 10 and second side 10b of substrate 10, e.g., when the pressure p in the outer volume differs from the difference pressure p0 in the inner volume. (In contrast, when the pressure is equal at first side 10a of substrate 10 and second side 10b of substrate 10, e.g. when pressure p in the outer volume is equal to reference pressure p0 in the inner volume, membrane 12 has its initial shape.) A warping of membrane 12 induced by the pressure difference can be understood as warping of membrane 12 into the inner volume and/or warping of the membrane out from the inner volume.

The micromechanical component also has at least one actuator electrode 16 that is connected at least to membrane 12 in such a way that the at least one actuator electrode 16 is capable of being displaced/is displaced relative to substrate 10 by the warping of membrane 12 relative to substrate 10, in each case along a displacement axis 18 oriented parallel to second side 10b of substrate 10. The at least one actuator electrode 16 can thus be moved (directly) towards at least one first stator electrode 20a by the warping of membrane 12, and/or can be moved (directly) away from at least one second stator electrode 20b by the warping of membrane 12, and the at least one first stator electrode 20a and/or the at least one second stator electrode 20b can be situated in a common layer (or plane) with the at least one actuator electrode 16, with boundary surfaces oriented parallel to second side 10b of the substrate.

The at least one actuator electrode 16, the at least one first stator electrode 20a, and/or the at least one second stator electrode 20b can therefore be structured out from a semiconductor and/or metallic layer 22 formed over second side 10b of substrate 10. The electrode spacings between electrodes 16, 20a, and 20b can thus be chosen relatively freely. A base capacitance present between electrodes 16, 20a, and 20b can therefore be comparatively high. It is also to be noted that an electrode configuration of electrodes 16, 20a, and 20b is comparatively space-saving/volume-saving.

In the specific embodiment of FIGS. 1a and 1b, the at least one actuator electrode 16 is in each case a comb electrode 16 having electrode fingers oriented perpendicular to its axis of displacement. Correspondingly, the at least one first stator electrode 20a and/or the at least one second stator electrode 20b is also in each case a comb electrode 20a or 20b having electrode fingers oriented perpendicular to axis of displacement 18 of the associated actuator electrode 16. A change in capacitance of at least a capacitance present between electrodes 16, 20a, and 20b is thus proportional to the displacement movement of the at least one actuator electrode 16 along its axis of displacement 18, proportional to the warping of membrane 12, and therefore also proportional to a change in pressure p. This can also be described by saying that a change in pressure p causes a linear change in capacitance of the at least one capacitance present between electrodes 16, 20a, and 20b.

A further advantage of the micromechanical component of FIGS. 1a and 1b is that the electrode configuration realized by electrodes 16, 20a, and 20b does not require a large-surface connection of the at least one first stator electrode 20a and/or of the at least one second stator electrode 20b to substrate 10. Therefore, the electrode configuration realized by electrodes 16, 20a, and 20b is also relatively insensitive to an external action of pressure or force, even to a bending of substrate 10.

Preferably, the at least one actuator electrode is connected to membrane 12 at least via at least one torsion spring 24a and 24b, which is capable of rotation, due to the warping of membrane 12, about a respective torsion axis 26a and 26b, in such a way that the at least one actuator electrode 16 is capable of displacement/is displaced relative to substrate 10 by the warping of membrane 12 in each case along its displacement axis 18 oriented parallel to second side 10b of substrate 10. In this way, a comparatively simple and easily structurable spring type can be used to connect the at least one actuator electrode 16 to membrane 12.

Advantageously, in this specific embodiment of the micromechanical component, the at least one actuator electrode 16 is connected to substrate 10 in each case via at least one U-shaped and/or meander-shaped spring 28 in such a way that a displacement movement, oriented perpendicular to second side 10b of substrate 10, of the at least one actuator electrode 16 is prevented by the at least one U-shaped and/or meander-shaped spring 28. An undesired drifting of the at least one actuator electrode 16 out from the layer (or plane) spanned by electrodes 16, 20a, and 20b, with boundary surfaces oriented parallel to second side 10b of substrate 10, when there is a warping of membrane 12 therefore does not have to be accepted.

In the micromechanical component of FIGS. 1a and 1b, a connection of actuator electrodes 16 to membrane 12 is realized via a respective first torsion spring 24a and a respective second torsion spring 24b (as the at least one torsion spring 24a and 24b). First torsion spring 24a can be oriented parallel to the associated second torsion spring 24b. A first torsion axis 26a of first torsion spring 24a is preferably parallel to a second torsion axis 26b of the associated second torsion spring 24b. Moreover, torsion springs 24a and 24b (or torsion axes 26a and 26b of the two interacting torsion springs 24a and 24b) can run parallel to second side 10b of substrate 10.

Advantageously, the respective first torsion spring 24a is connected to membrane 12 in such a way that through the warping of membrane 12 a force oriented perpendicular to second side 10b of substrate 10 is exerted on ends of the respective first torsion spring 24a. Associated second torsion spring 24b is connected to first torsion spring 24a, but cannot be deflected along with it due to its coupling to the associated actuator electrode 16 (held by the at least one U-shaped and/or meander-shaped spring 28). Therefore, the two torsion springs 24a and 24b twist about their torsion axes 26a and 26b, causing the warping movement of membrane 12 to be converted into the displacement movement, oriented parallel to second side 10b of substrate 10, of the associated actuator electrode 16.

Moreover, the micromechanical component of FIGS. 1a and 1b has a plane of symmetry 30 relative to which the exactly two actuator electrodes 16 of the micromechanical component and/or the stator electrodes 20a and 20b are disposed in mirror-symmetrical fashion. In addition, membrane 12 is centrically sectioned by plane of symmetry 30. An overall spring suspension of the at least one actuator electrode 16 made up of torsion springs 24a and 24b and U-shaped and/or meander-shaped springs 28 can be mirror-symmetrical relative to plane of symmetry 30. In particular, torsion springs 24a and 24b can run perpendicular to plane of symmetry 30. In addition, axis of displacement 18 of the at least one actuator electrode 16 can be situated in plane of symmetry 30. This ensures a relatively high freedom from tilting of the displacement movements, triggered by the warping of membrane 12, of the exactly two actuator electrodes 16 along axis of displacement 18. As an advantageous development, the at least two actuator electrodes 16, stator electrodes 20a and 20b, torsion springs 24a and 24b, and/or the U-shaped and/or meander-shaped springs 28 can also be fashioned mirror-symmetrically relative to a further plane of symmetry 31 that is oriented perpendicular to plane of symmetry 30 and that centrically sections membrane 12.

In the specific embodiment of FIGS. 1a and 1b, the two first torsion springs 24a of the two actuator electrodes 16 are mounted via two web elements 32 (running parallel to plane of symmetry 30) in such a way that the two first torsion springs 24a and the two web elements 32 form a frame 34. Preferably, the frame is made mirror-symmetrical relative to plane of symmetry 30 and/or further plane of symmetry 31. This as well increases the robustness of the micromechanical component against bending of substrate 10.

Frame 34 surrounds a base element 36 fastened to membrane 12, which can be displaced, in a direction 38 oriented perpendicular to second side 10b of substrate 10, by the warping of membrane 12. Moreover, base element 36 is bound between two connecting webs 40 (extending perpendicular to plane of symmetry 30) in frame 34. In addition, each of the first torsion springs 24a is connected to the associated second torsion spring 24b by a respective spacing element 42 (running parallel to plane of symmetry 30). The movement of base element 36 in direction 38, triggered by the warping of membrane 12, thus triggers the twisting of torsion springs 24a and 24b about the associated torsion axes 26a and 26b. The displacement and bending movements of components 16, 24a, 24b, and 36 are schematically shown in FIG. 1b by arrows 44 and torsion axes 26a and 26b.

Preferably, a first height h1 of the at least one first torsion axis 26a of the at least one first torsion spring 24a from second side 10b of substrate 10 differs from a second height h2 of the at least one second torsion axis 26b of the at least one second torsion spring 24b from the second side 10b of substrate 10. A conversion ratio of a conversion of the warping of membrane 12 into the displacement movements of actuator electrodes 16 is determined by a ratio of a distance d of first torsion springs 24a/torsion axes 26a to their associated second torsion springs 24b/torsion axes 26b relative to a difference Δ that indicates the difference Δ between first height h1 of first torsion springs 24a/torsion axes 26a (from the second side 10b of substrate 10) and second height h2 of second torsion springs 24b/torsion axis 26b (from the second side 10b of substrate 10). In particular, the distance d of the at least one first torsion axis 26a of the at least one first torsion spring 24a to the second torsion axis 26b of its associated second torsion spring 24b is smaller than fifteen times the difference Δ between first height h1 of the respective first torsion axis 26a (from second side 10b of substrate 10) and second height h2 of second torsion axis 26b (from second side 10b of substrate 10). Specifically, the distance d can be smaller than the difference Δ.

In order to obtain different heights h1 and h2, a respective first additional mass 46a per first torsion spring 24a and/or a respective second additional mass 46b per second torsion spring 24b can be used. Additional masses 46a and 46b can be understood as cuboidal subunits of torsion springs 24a and 24b, having a first width b1 greater than a second width b2 of remaining areas of torsion springs 24a or 24b (given a presence of torsion springs 24a and 24b in their initial shape oriented parallel to second side 10b of the substrate and perpendicular to the mounting direction of the respective torsion spring 24a or 24b). If the respective first additional mass 46a is present on a side of first torsion spring 24a oriented toward substrate 10, then the assigned second torsion string 24b has its second additional mass 46b preferably on a side oriented away from substrate 10. Correspondingly, if first additional mass 46a is present on a side of first torsion spring 24a oriented away from substrate 10, then second additional mass 46b is situated on a side of associated second torsion spring 24b oriented toward substrate 10. The at least one first torsion spring 24a and/or the at least one second torsion spring 24b can thus each be fashioned as a T-shaped spring. (This is to be understood as a spring shape that has a T-shaped cross-section perpendicular to a direction of mounting of the respective torsion spring 24a or 24b.) T-shaped springs have a low torsional rigidity, but have a high degree of rigidity relative to bending about a bending axis oriented parallel or perpendicular to second side 10b of substrate 10.

The at least one U-shaped and/or meander-shaped spring 28 can be anchored close to membrane 12 on substrate 10 (at at least one anchoring region 47a). The at least one first electrode 20a and/or the at least one second stator electrode 20b can also be anchored close to membrane 12 on substrate 10 (at at least one anchoring region 47b). Moreover, on second side 10b of substrate 10 printed conductors 48a, 48b, and 48c can be fashioned via which a contacting of electrodes 16, 20a, and 20b is realized.

Figure 2:
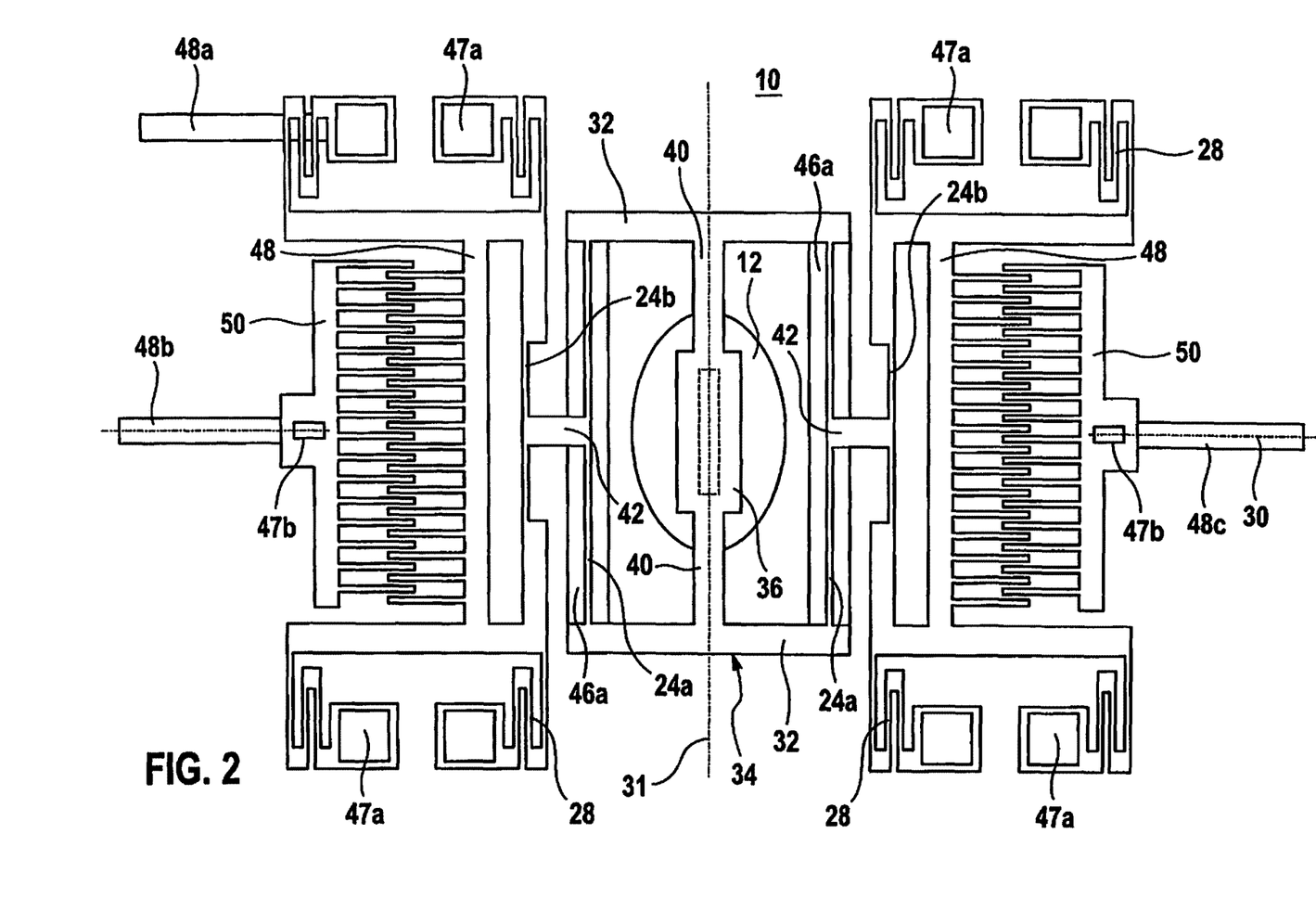
FIG. 2 shows a schematic representation of a second specific embodiment of the micromechanical component.

FIG. 2 shows a schematic representation of a second specific embodiment of the micromechanical component.

The specific embodiment of FIG. 2 differs from the micromechanical component of FIGS. 1a and 1b in that the at least one actuator electrode 48 is in each case a comb electrode 48 having electrode fingers oriented along and/or parallel to its axis of displacement. Correspondingly, each stator electrode 50 assigned to the at least one actuator electrode 48 has electrode fingers oriented along and/or parallel to axis of displacement 18 of the associated actuator electrode 48.

A displacement of the at least one actuator electrode 48 along its axis of displacement 18 brings about an "immersion" of its electrode fingers into intermediate spaces formed by the electrode fingers of the associated stator electrode 50. A change in capacitance of at least one capacitance present between electrodes 48 and 50 thus changes in linear fashion with the displacement movement of the at least one actuator electrode 48, the warping of membrane 12, and thus also with the change of pressure p. The change in capacitance remains linear even given a comparatively large deflection of the at least one actuator electrode 48.

Thus, in this specific embodiment as well, a very simple and fully differential electrode configuration is realized in which the at least one actuator electrode 48 and the at least one associated stator electrode 50 can be structured out from a common semiconductor and/or metallic layer 22 formed on second side 10b of substrate 10. In addition, this specific embodiment of the micromechanical component has a high degree of robustness relative to a bending of substrate 10, due to the comparatively small-surface connection of the at least one stator electrode 50 to substrate 10.

Figure 3A:
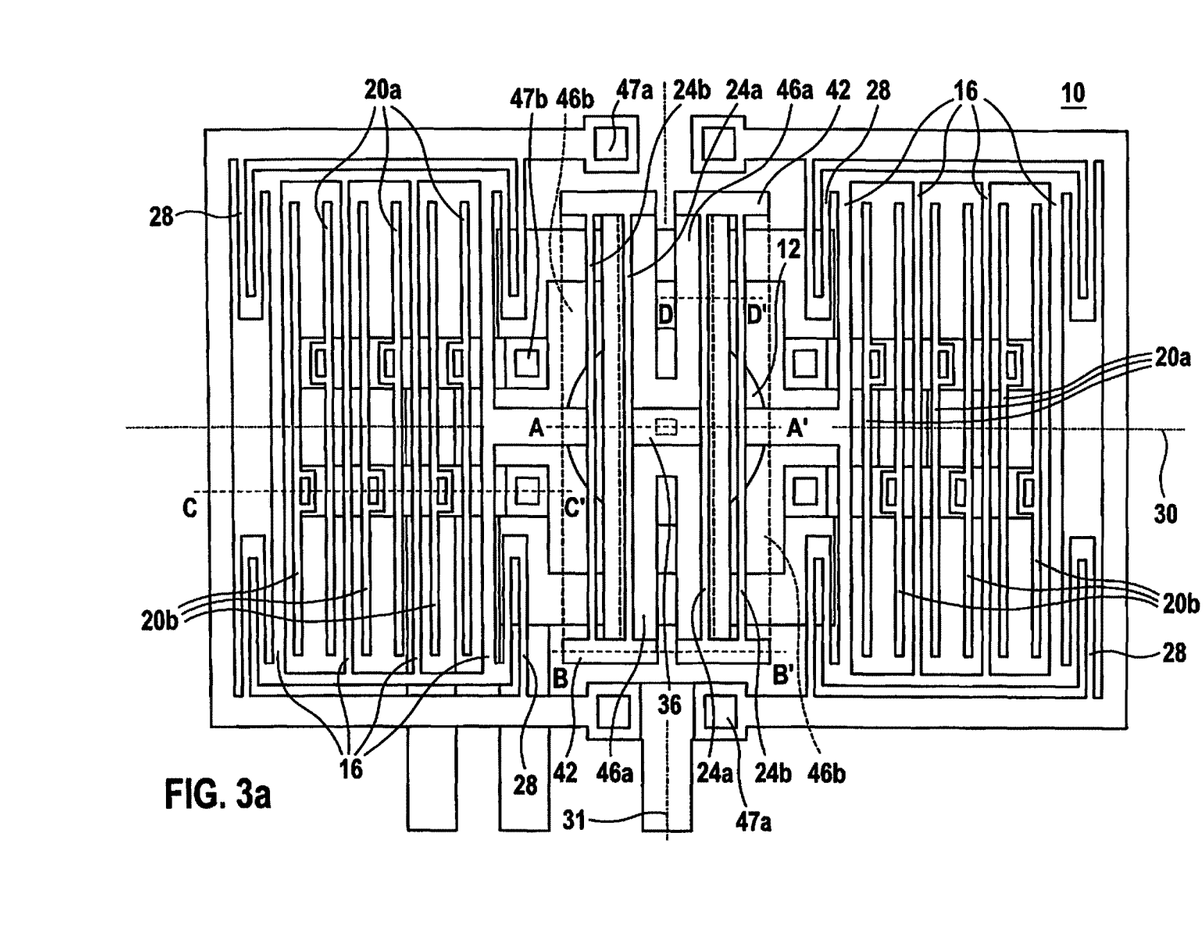
Figure 3B:
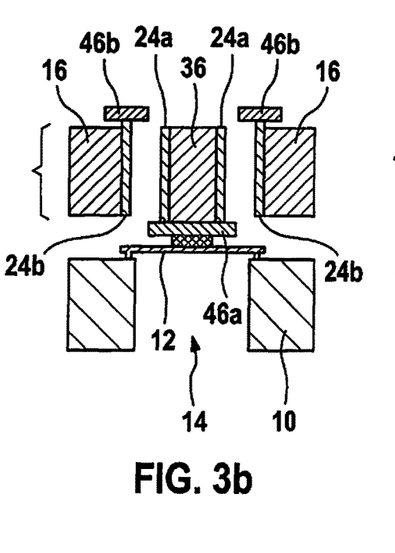
Figure 3C:
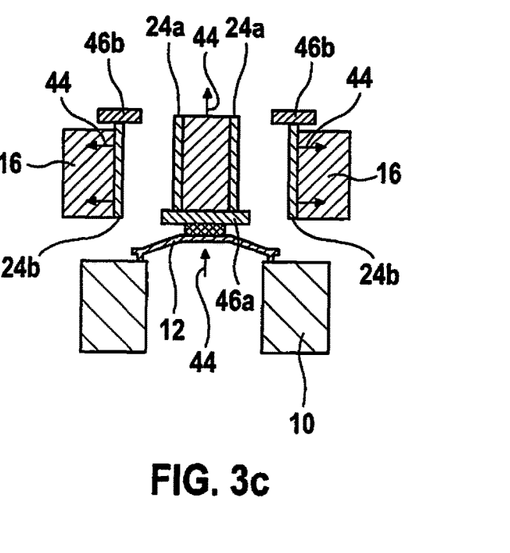
Figure 3D:
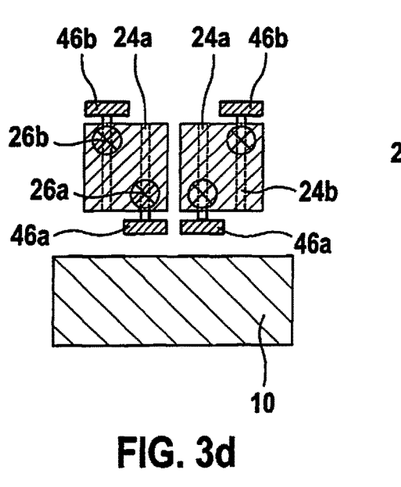
Figure 3E:
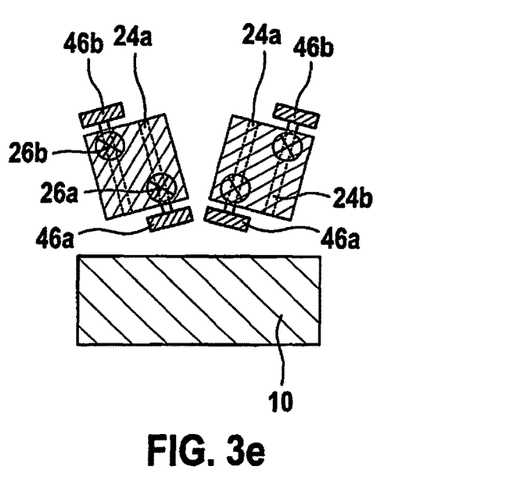
Figure 3F:
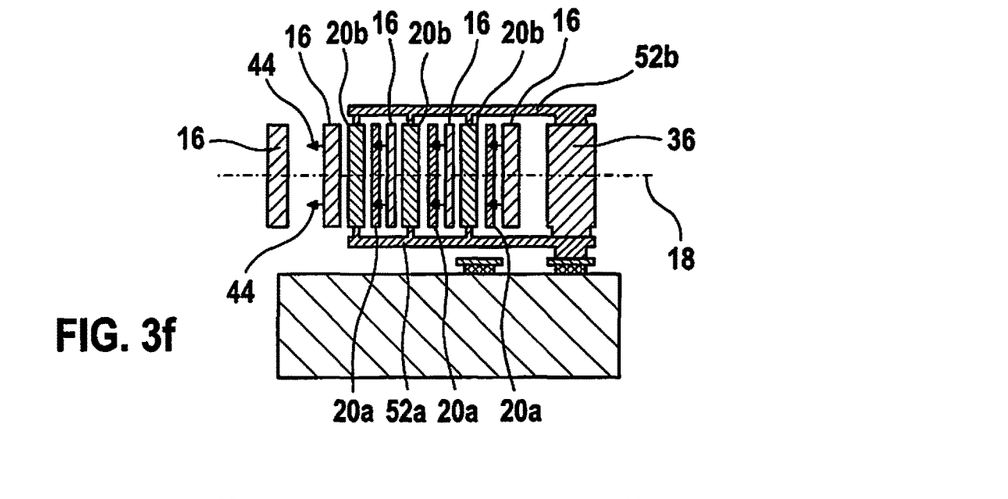
Figure 3G:
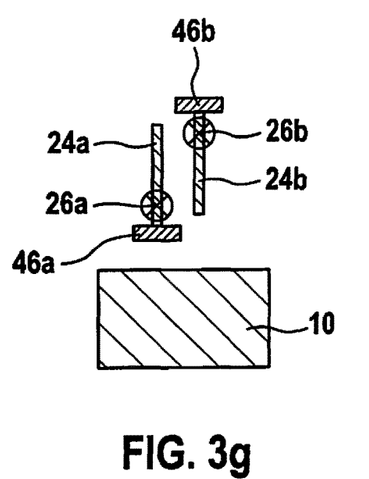
Figure 3H:
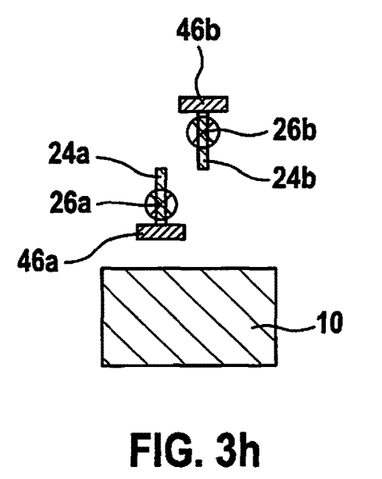

FIGS. 3a through 3h show schematic representations of a third specific embodiment of the micromechanical component, FIG. 3a showing a top view, FIGS. 3b and 3c showing cross-sections along the line AA' of FIG. 3a, FIGS. 3d and 3e showing cross-sections along the line BB' of FIG. 3a, FIG. 3f showing a cross-section along the line CC' of FIG. 3a, and FIGS. 3g and 3h showing cross-sections along the line DD' of FIG. 3a.

In the specific embodiment of FIGS. 3a through 3h, torsion springs 24a and 24b are situated so close to membrane 12 that a projection of torsion springs 24a and 24b runs through membrane 12 perpendicular to second side 10b of substrate 10. Moreover, the at least one stator electrode 20a and 20b is connected/held not directly on substrate 10 but rather on at least one first web 52a that is mounted/stands free in a gap between second side 10b of substrate 10 and the at least one stator electrode 20a and 20b, and/or on at least one second web 52b mounted/standing free on at least one side, oriented away from substrate 10, of the at least one stator electrode 20a and 20b. (Instead of the "mounting at both sides," shown in FIG. 3f, of the at least one stator electrode 20a and 20b by first web 52a and second web 52b, a "one-sided mounting" is also possible.) A bending of substrate 10 thus has no effect/very little effect on the distances between electrodes 16, 20a, and 20b.

FIG. 3g shows a cross-section through torsion springs 24a and 24b. First width b1 of additional masses 46a and 46b can be selected such that projections of additional masses 46a and 46b perpendicular to second side 10b of substrate 10 overlap. Moreover, first additional masses 46a can be made in one piece with base element 36. As is shown by FIG. 3h, in an alternative specific embodiment the remaining areas of torsion springs 24a or 24b can also be realized having different heights (or can be structured out from different semiconductor and/or metallic layers). Preferably, line 48a forms a "frame" that is mirror-symmetrical relative to axes of symmetry 30 and 31, whereby the micromechanical component is made more resistant to bending.

With regard to further features of the specific embodiment of FIGS. 3a through 3h, reference is made to the micromechanical component of FIG. 1. It is again to be noted that in the specific embodiment of FIGS. 3a through 3h as well, a change in capacitance of the at least one capacitance present between electrodes 16, 20a, and 20b is proportional to the displacement movement of the at least one actuator electrode 16 and to the warping of the membrane, and is thus proportional to a change in pressure p.

All of the micromechanical components described above can for example advantageously be used in a microphone or in a pressure sensor. Moreover, all micromechanical components described above can interact with a low-cost evaluation electronics unit that converts the changes in capacitance into pressure changes relative to pressure p. Preferably, torsion springs 24a and 24b have a rigidity parallel to second side 10b of substrate 10 that is at least greater than 10% of the rigidity of springs 28 parallel to second side 10b of substrate 10, in particular at least greater than 50% of the rigidity of springs 28 parallel to second side 10b of substrate 10. A suspension of the at least one actuator electrode 16 preferably has a rigidity, perpendicular to second side 10b of substrate 10, that is at least greater than 10% of the rigidity of torsion springs 24a and 24b perpendicular to second side 10b of substrate 10, in particular at least greater than 50% of the rigidity of torsion springs 24a and 24b perpendicular to second side 10b of substrate 10.

Figure 4:
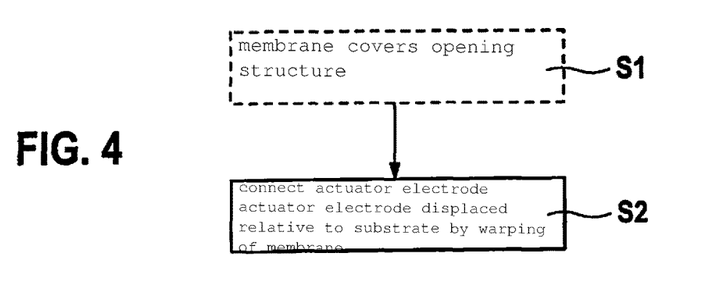
FIG. 4 shows a flow diagram explaining a specific embodiment of the production method for a micromechanical component.

FIG. 4 shows a flow diagram explaining a specific embodiment of the production method for a micromechanical component.

All micromechanical components described above can be produced using production methods described below. However, it is to be noted that the practicability of the production method described below is not limited to a production of a particular specific embodiment.

In an optional method step S1, a membrane that covers an opening structured into the substrate going out from a first side of the substrate is fashioned in such a way that the membrane is warped by a pressure difference between the first side of the substrate and a second side of the substrate oriented away from the first side. However, as an alternative to carrying out method step S1, an already-produced substrate having the corresponding membrane can be used for the production method described below.

In a method step S2, at least one actuator electrode is connected at least to the membrane in such a way that the at least one actuator electrode is displaced relative to the substrate by a warping of the membrane. Here, the at least one actuator electrode is connected at least to the membrane in such a way that the at least one actuator electrode is displaced relative to the substrate by the warping of the membrane, in each case along a displacement axis oriented parallel to the second side of the substrate. Thus, carrying out the production method described here also produces the advantages explained above.

As initial material for carrying out method steps S1 and S2, a layer construction can be used as can be seen in the rest of FIG. 1b: on substrate 10, such as a semiconductor substrate 10 (in particular a silicon substrate 10), first a first insulating layer (not shown in FIG. 1b), such as a silicon dioxide layer, is formed (before or after the structuring of opening 14). The first semiconductor layer, in particular a thin polysilicon layer, is then formed on the first insulating layer. From the first semiconductor layer, membrane 12 and lines 48a through 48c can then (later) be structured out. The first semiconductor layer is at least partly covered by a second insulating layer (not shown in FIG. 1b), such as a silicon dioxide layer. A second semiconductor layer, preferably a central polycrystalline silicon layer, is deposited on the second insulating layer. From the second semiconductor layer, a part of base element 36, first webs 52a, first additional masses 46a, and/or second additional masses 46b are structured out. A third insulating layer (not shown in FIG. 1b) (e.g. a silicon dioxide layer) covers the second semiconductor layer at least partly. Subsequently, a third semiconductor layer 22, preferably a thick epi-polysilicon layer, is deposited on the third insulating layer. Actuator electrodes 16 or 48, stator electrodes 20a, 20b, or 50, U-shaped and/or meander-shaped springs 28, the remaining regions of torsion springs 24a and 24b, web elements 32, a further part of base element 36, and/or spacer elements 42 are structured out (later) from third semiconductor layer 22. Optionally, third semiconductor layer 22 can be covered at least partly with a fourth insulating layer (e.g. a silicon dioxide layer) (not shown in FIG. 1b). Subsequently, a fourth semiconductor layer (not shown in FIG. 1b) can be formed on the fourth insulating layer, from which fourth semiconductor layer second webs 52b, first additional masses 46a, and/or second additional masses 46b can also be structured out.

What is claimed is:

1. A micromechanical component, comprising:
    a substrate;
    a membrane that covers an opening structured into the substrate from a first side of the substrate, and that can be warped by a pressure difference between the first side of the substrate and a second side, oriented away from the first side, of the substrate; and
    at least one actuator electrode that is connected at least to the membrane in such a way that the at least one actuator electrode is displaced relative to the substrate by a warping of the membrane, the at least one actuator electrode being capable of being displaced relative to the substrate by the warping of the membrane, in each case along a displacement axis oriented parallel to the second side of the substrate;
    wherein the at least one actuator electrode is connected to the membrane at least by at least one torsion spring that is capable of being rotated about a respective torsion axis by the warping of the membrane, in such a way that the at least one actuator electrode is capable of being displaced relative to the substrate by the warping of the membrane, in each case along its axis of displacement oriented parallel to the second side of the substrate.

2. The micromechanical component as recited in claim 1, wherein the at least one actuator electrode is connected to the membrane via a respective first torsion spring and a respective second torsion spring as the at least one torsion spring.

3. The micromechanical component as recited in claim 2, wherein a first height of the at least one first torsion axis of the at least one first torsion spring from the second side of the substrate differing from a second height of the at least one second torsion axis of the at least one second torsion spring from the second side of the substrate, the first and second torsion axis running parallel to the second side of the substrate.

4. The micromechanical component as recited in claim 3, wherein a distance of the at least one first torsion axis of the at least one first torsion spring from the second torsion axis of its associated second torsion spring is smaller than fifteen times a difference between the first height and the second height, the first torsion axis and the second torsion axis being oriented parallel to one another.

5. The micromechanical component as recited in claim 1, wherein the at least one actuator electrode is connected to the substrate in each case by at least one of a U-shaped spring and a meander-shaped spring, in such a way that a displacement movement, oriented perpendicular to the second side of the substrate, of the at least one actuator electrode is prevented by the at least one of the U-shaped spring and the meander-shaped spring.

6. The micromechanical component as recited in claim 1, wherein the at least one actuator electrode is in each case a comb electrode having electrode fingers oriented at least one of along its axis of displacement and parallel to its axis of displacement.

7. The micromechanical component as recited in claim 1, wherein the at least one actuator electrode is, in each case, a comb electrode having electrode fingers oriented perpendicular to its axis of displacement.

8. The micromechanical component as recited in claim 1, wherein the micromechanical component has exactly two actuator electrodes as the at least one actuator electrode, and the membrane being centrically sectioned by a plane of symmetry relative to which the two actuator electrodes are mirror-symmetrical.

9. A microphone having a micromechanical component, the micromechanical component comprising:
    a substrate;
    a membrane that covers an opening structured into the substrate from a first side of the substrate, and that can be warped by a pressure difference between the first side of the substrate and a second side, oriented away from the first side, of the substrate; and
    at least one actuator electrode that is connected at least to the membrane in such a way that the at least one actuator electrode is displaced relative to the substrate by a warping of the membrane, the at least one actuator electrode being capable of being displaced relative to the substrate by the warping of the membrane, in each case along a displacement axis oriented parallel to the second side of the substrate;
    wherein the at least one actuator electrode is connected to the membrane at least by at least one torsion spring that is capable of being rotated about a respective torsion axis by the warping of the membrane, in such a way that the at least one actuator electrode is capable of being displaced relative to the substrate by the warping of the membrane, in each case along its axis of displacement oriented parallel to the second side of the substrate.

10. A pressure sensor having a micromechanical component, the micromechanical component comprising:
   a substrate;
   a membrane that covers an opening structured into the substrate from a first side of the substrate, and that can be warped by a pressure difference between the first side of the substrate and a second side, oriented away from the first side, of the substrate; and
   at least one actuator electrode that is connected at least to the membrane in such a way that the at least one actuator electrode is displaced relative to the substrate by a warping of the membrane, the at least one actuator electrode being capable of being displaced relative to the substrate by the warping of the membrane, in each case along a displacement axis oriented parallel to the second side of the substrate;
   wherein the at least one actuator electrode is connected to the membrane at least by at least one torsion spring that is capable of being rotated about a respective torsion axis by the warping of the membrane, in such a way that the at least one actuator electrode is capable of being displaced relative to the substrate by the warping of the membrane, in each case along its axis of displacement oriented parallel to the second side of the substrate.

* * * * *